United States Patent
Wu et al.

(10) Patent No.: US 9,281,311 B2
(45) Date of Patent: Mar. 8, 2016

(54) MEMORY CELL ARRAY INCLUDING A WRITE-ASSIST CIRCUIT AND EMBEDDED COUPLING CAPACITOR AND METHOD OF FORMING SAME

(71) Applicant: Taiwan Semiconductor Manufacturing Co., Ltd., Hsin-Chu (TW)

(72) Inventors: Ching-Wei Wu, Caotun Town (TW); Wei-Shuo Kao, Taichung (TW); Chia-Cheng Chen, Toufen Township (TW); Kuang Ting Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 35 days.

(21) Appl. No.: 14/031,057

(22) Filed: Sep. 19, 2013

(65) Prior Publication Data
US 2015/0076575 A1    Mar. 19, 2015

(51) Int. Cl.
| H01L 27/108 | (2006.01) |
| H01L 29/94 | (2006.01) |
| H01L 27/11 | (2006.01) |
| G11C 7/12 | (2006.01) |
| G11C 7/18 | (2006.01) |
| G11C 11/419 | (2006.01) |
| G11C 11/412 | (2006.01) |

(52) U.S. Cl.
CPC .............. *H01L 27/1116* (2013.01); *G11C 7/12* (2013.01); *G11C 7/18* (2013.01); *G11C 11/419* (2013.01); *H01L 29/94* (2013.01); *G11C 11/412* (2013.01); *G11C 2207/005* (2013.01)

(58) Field of Classification Search
CPC ...... H01L 27/1116; H01L 29/94; G11C 7/18; G11C 11/419; G11C 7/12
See application file for complete search history.

(56) References Cited

U.S. PATENT DOCUMENTS

| 5,208,782 | A * | 5/1993 | Sakuta et al. ............. 365/230.03 |
| 6,323,099 | B1 * | 11/2001 | Long et al. .................... 438/396 |
| 6,735,107 | B1 | 5/2004 | Takashima |
| 2012/0307574 | A1 | 12/2012 | Cheng et al. |
| 2014/0112062 | A1 * | 4/2014 | Trivedi et al. ................. 365/154 |

* cited by examiner

*Primary Examiner* — Stephen W Smoot
*Assistant Examiner* — Vicki B Booker
(74) *Attorney, Agent, or Firm* — Duane Morris LLP

(57) ABSTRACT

An integrated circuit includes a plurality of metal layers of bit cells of a memory cell array disposed in a first metal layer and extending in a first direction, a plurality of word lines of the memory cell array disposed in a second metal layer and extending in a second direction that is different from the first direction, and at least two conductive traces disposed in a third metal layer substantially adjacent to each other and extending at least partially across the memory cell array, a first one of the at least two conductive traces coupled to a driving source node of a write assist circuit, and a second conductive trace of the at least two conductive traces coupled to an enable input of the write-assist circuit, where the at least two conductive traces form at least one embedded capacitor having a capacitive coupling to the bit line.

20 Claims, 9 Drawing Sheets

MEMORY CELL ARRAY INCLUDING A WRITE-ASSIST CIRCUIT AND EMBEDDED COUPLING CAPACITOR AND METHOD OF FORMING SAME

FIELD

This disclosure relates, most generally, to semiconductor devices and manufacturing and more specifically to integrated circuits and methods for forming an integrated circuit having a metallized coupling capacitor.

BACKGROUND

Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them even when not powered.

SRAM cells may comprise different numbers of transistors. According to the total number of transistors in an SRAM cell, the SRAM cell may be referred to as a six-transistor (6-T) SRAM, an eight-transistor (8-T) SRAM, and the like. SRAM cells are arranged in rows and columns. An SRAM cell is selected during either a READ operation or a WRITE operation by selecting its row and column.

Each column of SRAM cells is connected to both a bit-line (BL) and the inverse of BL (BLB). A data latch of each SRAM cell is used to store a single bit. Both BL and BLB are can be used to control the operation of reading a bit from or writing a bit into the SRAM cell. One storage node of the data latch is discharged by BL to "0" and then it flips the other storage node. The BLB's charging is minor to the WRITE operation. Negative bit lines (NLB) can include write-assist circuitry that limits the design or configurability of a particular design. Despite the limiting nature of the write operation, it is critical that input data being written to constituent memory cells (or bit cells) be presented to the memory cells under conditions that ensure proper execution of write operation. Write assist circuitry helps the write operation complete under some circumstances, such as when the power supply level (unit: volt) is low. Many circumstances exacerbate the problem. For example, when the power supply becomes lower or the bit-cell's variation becomes worse.

BRIEF DESCRIPTION OF THE DRAWING

The present embodiments are best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. This description of the exemplary embodiments is intended to be read in connection with the accompanying drawings, which are to be considered part of the entire written description.

DETAILED DESCRIPTION

Figure 1:
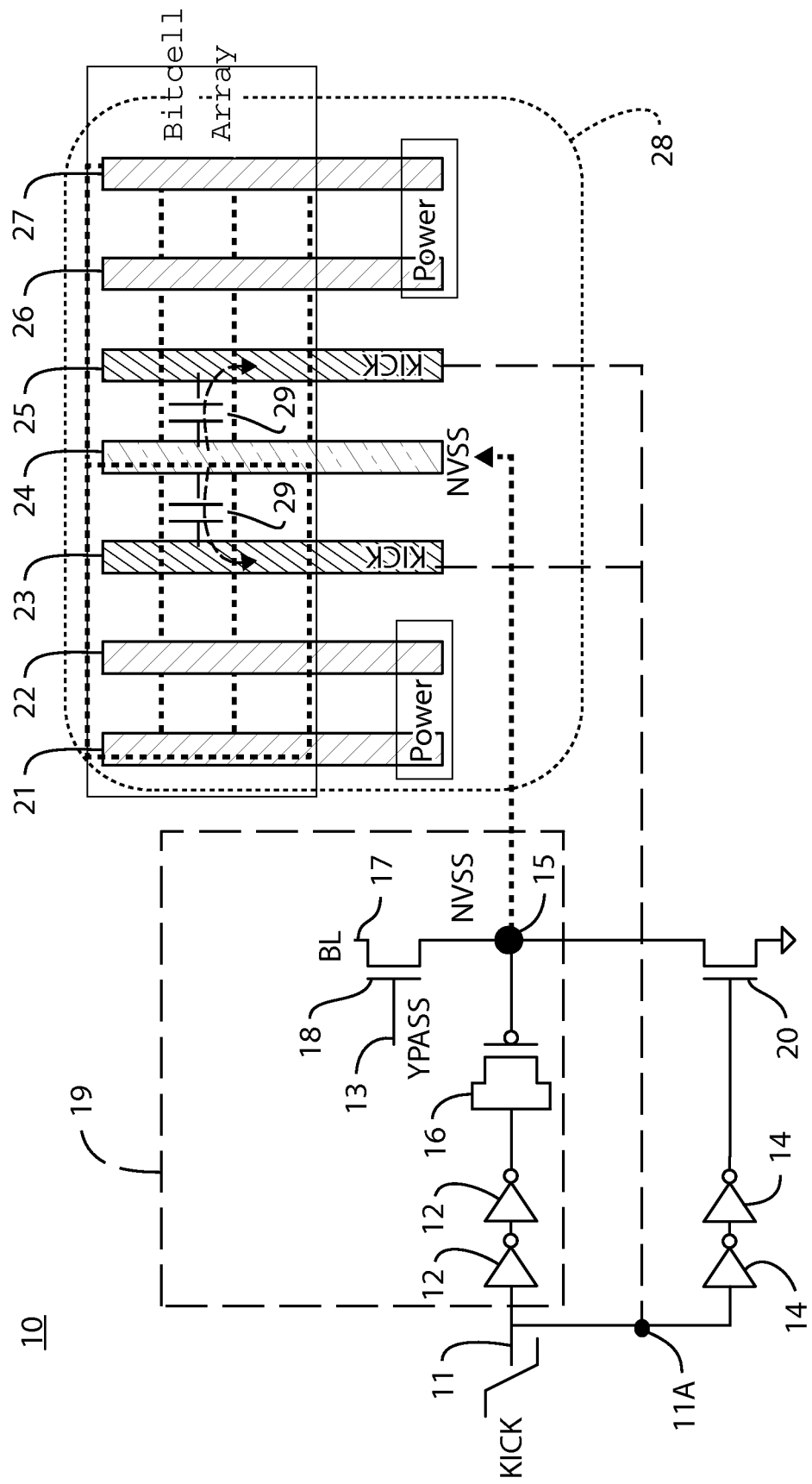
FIG. 1 is a simplified block diagram of a memory cell array having a metal coupling capacitor according to one embodiment of the present subject matter.

With reference to the figures where like elements have been given like numerical designations to facilitate an understanding of the present subject matter, various embodiments of a system or apparatus and method for generating a ramp voltage signal are described. In order to more fully understand the present subject matter, a brief description of applicable circuitry will be helpful.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

FIG. 1 is a simplified block diagram of a memory cell array 10 having a metal coupling capacitor 29. In some embodiments, the memory cell array 10 includes a write-assist circuit 19 including two serially coupled inverters 12, a metal oxide semiconductor capacitor or MOS-CAP 16 coupled to the output of the inverters 12 and an n-type metal oxide semiconductor (nMOS) transistor 18 having a source coupled to a driving source node 15 ("NVSS") and a drain coupled to a bit line 17. In some embodiments, the MOS-CAP 16 is made of a semiconductor body or substrate, an insulator film, such as SiO2, and a metal electrode called a gate. The oxide film can be as thin as 1.5 nm. One nanometer is equal to 10 Å, or the size of a few oxide molecules. A driving source node 15 has a negative voltage potential, i.e., is a signal below ground potential, used for writing operations to the bit line. The MOS-CAP 16 is a transistor with source and drain terminals coupled together as shown and a gate terminal coupled to node 15. Reversing the connection of the MOS-CAP (with source and drain terminals coupled to node 15) is also an equivalent. Either pmos or nmos transistor can be used for the MOS-CAP 16. Ultimately, the device 16 is a capacitor such as a device using transistors to form a capacitor such as MOS CAP 16. Hence, in some embodiments, the integrated circuits herein are used with negative bit line write-assist circuitry. The gate of the nMOS transistor 18 is coupled to a "YPASS" signal that serves to write to a column. A trigger signal 11 or enable input or "KICK" serves as an input to the write-assist circuit 19. The memory cell array 10 includes additional circuitry including another two serially coupled inverters 14 having an output coupled to the gate of another nMOS transistor 20. The nMOS transistor 20 has a source coupled to ground and a drain coupled to the driving source node 15.

The memory cell array 10 further includes one or more memory macro sub-blocks or "macro" 28 where each macro is driven by a respective write assist circuit 19. An SRAM macro is an embedded SRAM block in an application specific integrated circuit (ASIC). By embedding the SRAM on the integrated circuit (IC) chip with a digital signal processor (DSP) or other special purpose hardware, the chip designer avoids large latency between the DSP or hardware and a separate memory chip. Compared to using a separate SRAM chip, an embedded SRAM offers increased data bandwidth and reduced power consumption. The use of embedded SRAM also permits reduction in the overall footprint of products.

Each SRAM macro 28 is a collection of static memory elements arranged in rows and columns, and also the associated control circuitry that provides the means to read and write addressable subsets of those memory elements. An SRAM macro 28 typically includes some amount of redundant memory elements that may be used to replace defective memory elements. The macro 28 includes a plurality of metallization layers including a number of metal layers 21, 22, 26 and 27 used for power or as a ground connection depending on the bitcell array structure. The macro 28 further includes additional metallization that form embedded metal coupling capacitors 29 in the memory cell array 10. In accordance with present disclosure, at least two conductive traces or lines 23 and 24 are arranged and constructed substantially adjacent to each other and extending at least partially across the memory cell array 10. In some embodiments the conductive traces are formed in an "M3" or an "M4" layer or metal 3 or metal 4 layer. In some embodiments, a first conductive trace 24 of the at least two conductive traces is connected to the driving source node 15 of a bit line 17, and at least a second conductive trace 23 of the at least two conductive traces is connected to node 11A or to an enable input or trigger signal 11 of the write-assist circuit 19. In the embodiment of FIG. 1, the macro 28 also includes another conductive trace 25 that forms an embedded metal coupling capacitor 29 with conductive trace 24. Note that the capacitors 29 represent the capacitance between conductive traces 23 and 24 and conductive traces 25 and 24. According to the present disclosure, the capacitance between conductive traces 23, 24, and 25 serve to reduce the physical size of the MOS-CAP 16 or even enable MOS-CAP 16 to be eliminated in some embodiments. In some embodiments, the memory cell array 10 forms a portion of an SRAM, single port SRAM (SPSRAM), dual port SRAM (DPSRAM), two-port register file (2pRF) or ultra-high density two-port register file (UHD2pRF) configurable array. In some embodiments, the memory cell array 10 forms a portion of any type of SRAM.

Figure 2:
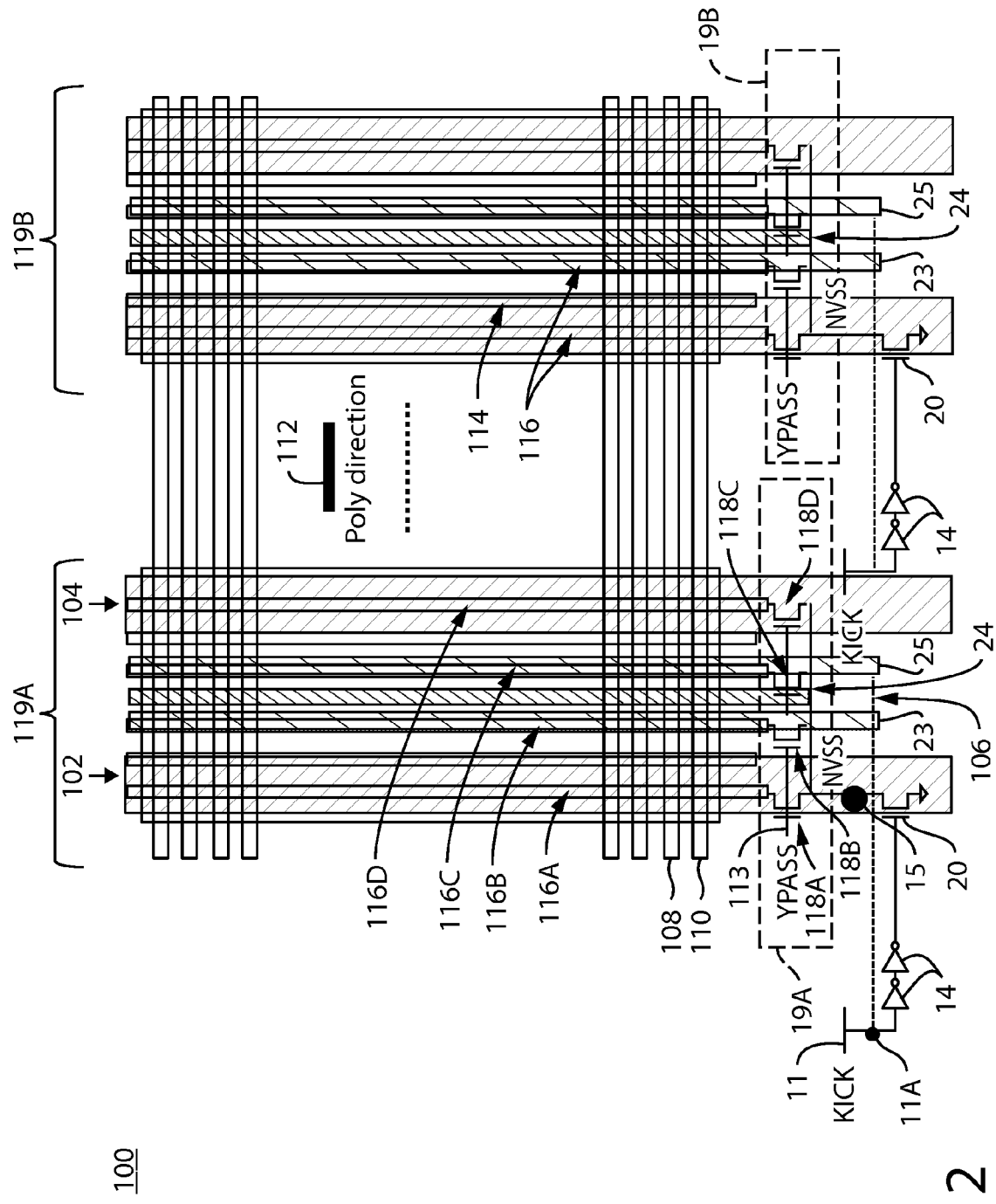
FIG. 2 is a schematic illustration of a memory cell array having a metal coupling capacitor according to another embodiment of the present subject matter.

In some embodiments, as illustrated in the memory cell array 100 of FIG. 2, the MOS CAP 16 can be eliminated by using the embedded metal coupling capacitors 19 represented by conductive traces 23, 24, and 25. As noted above, the memory cell array 100 is an integrated circuit having a plurality of metal layers (e.g., M1, M2, M3, M4, etc.) formed over a semiconductor substrate. In some embodiments, bit lines 116A, 116B, 116C, and 116D are formed in a first metal layer (e.g., M1 or M2 as examples), and word lines 110 are formed in a second metal layer (e.g., M2 or M3 as examples). In some embodiments, ground lines 108 are formed in the second metal layer, i.e., the same metal layer in which word lines 110 are formed. The bit lines 116A, 116B, 116C, and 116D are respectively coupled to drains of respective nMOS transistors 118A, 118B, 118C, and 118D. The sources of nMOS transistors 118A-118D are coupled to the driving source node 15 of write-assist circuit which include the nMOS transistors 118A-D in this embodiment. In FIG. 2, the conductive trace 24 is coupled to the source of nMOS transistor 118C. The driving source node 15 is coupled to a drain of nMOS transistor 20. The trigger signal or enable signal 11 is coupled to the gate of nMOS transistor 20 via the inverters 14.

At least a portion of a write-assist circuit can be formed in a third metal layer (e.g., M3 or M4). For example, conductive trace 23 and optionally the conductive trace 25, which are coupled to the trigger signal or write enable signal 11, can be formed in the third metal layer. Note, in some embodiments, the second metal layer is formed above the first metal layer and the third metal layer is formed above the second metal layer. The portion of the write-assist circuit formed in the third metal layer can further include the conductive trace 24, which can optionally be coupled to the source driving node 15. Power rails 102 and 104 for the memory cell array 100 can also be disposed in the third metal layer. The power rails 102 and 104 extend substantially across the memory cell array 100 in a first direction, which is parallel to the direction in which the bit cells 116A-D and conductive traces 23, 24, 25 extend. The power rails 102, 104 and the conductive traces 23, 24, and 25 form a part of the memory macro 119. At least two conductive traces (23 and 24) disposed in the third metal layer are arranged and constructed to be disposed substantially adjacent to each other and to extend at least partially across the memory cell array.

In some embodiments as illustrated by FIG. 2, the conductive traces 23, 24, and 25 extend substantially across the memory cell array 100. A first conductive trace 24 of the at least two conductive traces is connected to the driving source node 15, which is connected to the bit lines 116A-D through transistors 118A-D. A second conductive trace, such as conductive trace 23 or 25 of the at least two conductive traces, is connected to an enable input or trigger signal 11 of the write-assist circuit 19. In some embodiments, the two conductive traces 23 and 25 are shunted together and connected to the enable input or trigger signal 11 of the write-assist circuit via line 106. In some embodiments, the at least two conductive traces (24 and 23 or 25) disposed in the third metal layer are disposed substantially parallel to each other and extend substantially across the memory cell array 100. In some embodiments, the at least two conductive traces 24 and 23 or 25 are perpendicular or orthogonal to a gate electrode layer of a poly silicon layer 112. In some embodiments, the at least two conductive traces 24 and 23 or 25 are perpendicular or orthogonal to the word lines 110.

The embodiments of FIGS. 3-7 are variations of the embodiment of FIG. 2. Among the variations, the memory cell array 100 of FIG. 2 did not include a MOS-CAP, whereas the embodiments of FIGS. 3-7 include a MOS-CAP forming a part of a write-assist circuit 19. For example, in the memory cell array 130 of FIG. 3, the enable input or trigger signal 11 is coupled to a source and drain of a MOS-CAP 132 via optional inverters 12 (with the gate of MOS-CAP 132 being coupled to driving source node 15). Using the embodiments herein, the MOS-CAP 132 can have a smaller physical size while still providing sufficient capacitance for the shortest bit line among the plurality of bit lines 116 in the memory array 130.

The memory array 130 can have a number of bit lines of varying length within an SRAM macro or varying length among different SRAM macros. In some embodiments, the shortest bit line is the bit line closest to the MOS-CAP 132. Usually all the bit-lines have the same length, i.e. 119A and 119B have the same bit-line lengths. The "shortest" and "longest" bit-lines generally refer to bit-line lengths in different SRAM macro. In any case, some embodiments herein enable the use of one design to fit all possible bit-line lengths. By providing the embedded metal coupling capacitors 29 between traces 24 and 23 or 25, the conductive traces 24 and 23 or 25 can provide sufficient capacitance for the bit lines of varying length without having to over-design the MOS-CAP 132 for the shortest bit lines. In other words, a MOS-CAP capacitance value is designed for a shortest bit line, and the at least two conductive traces 23, 24, 25 form metal coupling capacitors 29 that track a bit line length of remaining bit lines other than the shortest bit line.

In some embodiments where the metal coupling capacitors 29 track the bit line length, the at least two conductive traces 23, 24, 25 provide a constant negative bit line voltage for different bit line lengths. Since the conductive traces 24, 23 or 25 track the bit line length of each varied length bit line, the capacitance on each varied length bit line will be relatively the same and so will the respective bit line voltages. For example, in FIG. 3, the at least two conductive traces 24 and 23 or 25 are disposed substantially adjacent to each other and extend across the memory cell array in a parallel fashion. In the memory cell array 130, the power lines 102, 104 and the conductive traces 23, 24, and 25 of the macro cell sub-block 119A driven by the write-assist circuit 19A having MOS-CAP 132. Another macro cell sub-block 119B is driven by the write-assist circuit 19B having MOS-CAP 133.

Figure 3:
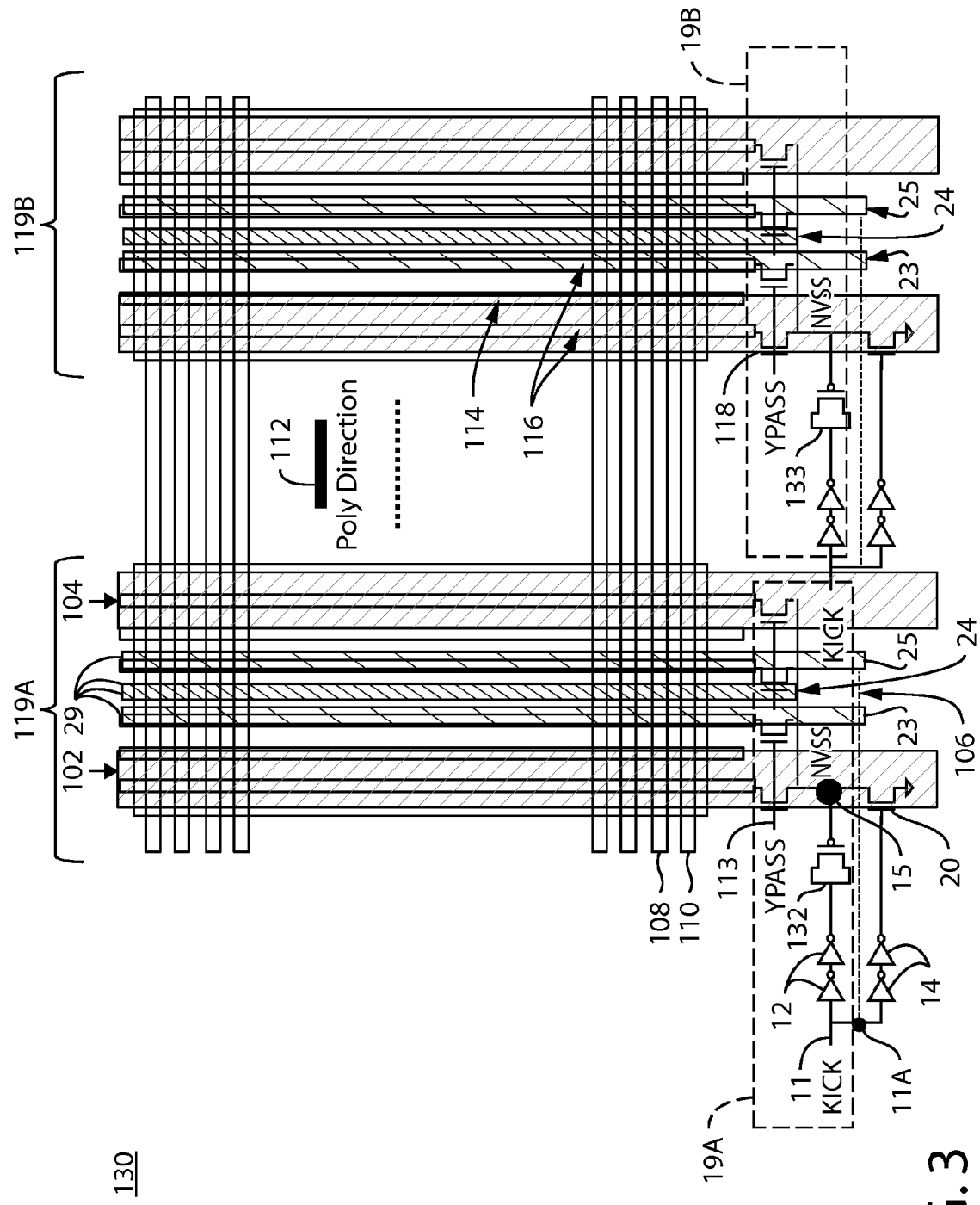
FIG. 3 is a schematic illustration of a memory cell array having a metal coupling capacitor and a MOS-CAP according to another embodiment of the present subject matter.

In some embodiments as shown in FIG. 3, the memory array 130 includes at least three conductive traces (24, 23 and 25) formed in the third metal layer such that the conductive traces are disposed substantially adjacent to each other and extend at least partially across the memory cell array 130. A middle conductive trace 24 of the at least three conductive traces connects to a driving source node 15 for the bit lines 116, and the other two conductive traces 23, 25, which are disposed on opposite sides of the middle conductive trace 24, are shunted together and connected to an enable input or trigger signal 11 of the write-assist circuit 19A via line 106. As shown, in some embodiments, each macro cell sub-block (e.g., 119A, 119B, etc.) has its own corresponding write-assist circuit (e.g., 19A, 19B, etc.).

Figure 4:
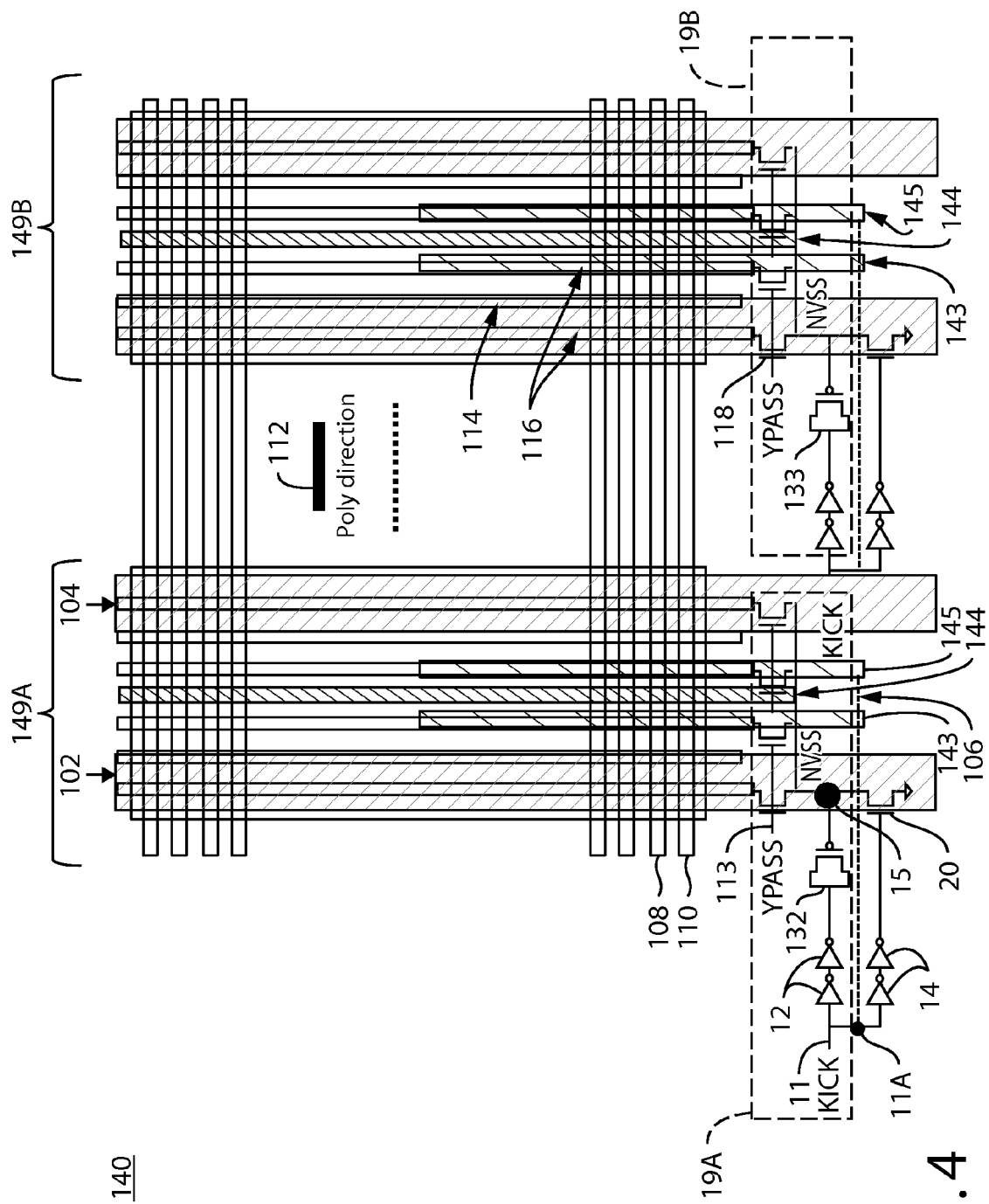
FIG. 4 is a schematic illustration of a memory cell array having a metal coupling capacitor extending at least partially across the memory cell array and a MOS-CAP according to another embodiment of the present subject matter.

The memory cell 140 of FIG. 4 is similar to the memory cell 130 of FIG. 3 with the exception of the length of the conductive traces 24 and 23 or 25 that run substantially the length of the memory array. Instead, at least two conductive traces 144 and 143 or 145 formed in a third metal layer are arranged substantially adjacent to each other and extend at least partially across the memory cell array 140. In some embodiments, the conductive traces 144, and 143 or 145 can be half as long or some other proportional length as long as the conductive traces 24 and 23 or 25 of FIG. 3. A first conductive trace 144 of the at least two conductive traces 143, 144, 145 connects to a driving source node 15 for driving the bit lines 116 through transistors 118. A second conductive trace 143 or 145 connects to an enable input or trigger signal 11 of the write-assist circuit 19. In the memory cell array 140, the power lines 102, 104 and the conductive traces 143, 144, and 145 form the macro cell sub-block 149A, which is driven by the write-assist circuit 19(A) having MOS-CAP 132. Another macro cell sub-block 149B is driven by the write-assist circuit 19B having MOS-CAP 133.

Figure 5:
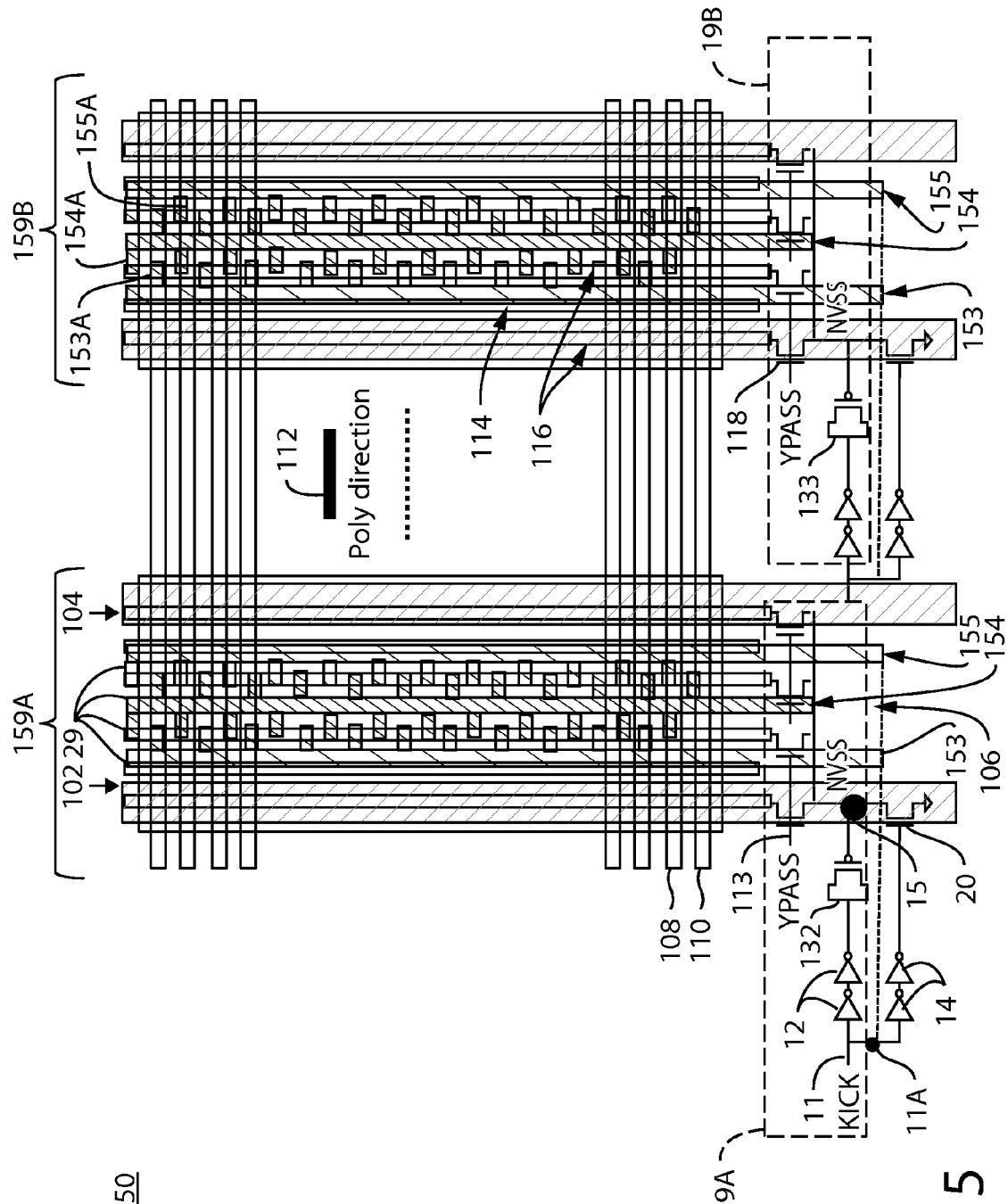
FIG. 5 is a schematic illustration of a memory cell array having a metal coupling capacitor substantially in a saw-tooth formation and a MOS-CAP according to another embodiment of the present subject matter.

The memory cell 150 of FIG. 5 is similar to the memory cell 130 of FIG. 3 with the exception of the shape or form of the conductive traces 24 and 23 or 25 that run substantially the length of the memory array. At least two conductive traces 154 and 153 or 155 of a third metal layer are arranged substantially adjacent to each other in a saw-tooth formation and extend at least partially across the memory cell array 150. In some embodiments, the saw tooth formation can include perpendicular segments 153A, 154A, and 155A that extend in a perpendicular direction from the longitudinal direction of the respective conductive traces 153, 154, and 155. In some embodiments, at least two conductive traces 154 and 153 or 155 formed in the third metal layer can vary in at least one of length, width, spacing or shape to form a metal coupling capacitor 29 in the memory cell array 150. As in the embodiment of FIG. 3, a first conductive trace 154 of the at least two conductive traces connects to a driving source node 15 for driving bit lines 116 through transistors 118. A second conductive trace 153 or 155 of the at least two conductive traces connects to an enable input or trigger signal 11 of the write-assist circuit. In the memory cell array 150, the power lines 102, 104 and the conductive traces 153, 154, and 155 form the macro cell sub-block 159A driven by the write-assist having MOS-CAP 132. Another macro cell sub-block 159B is driven by the write-assist circuit 19B having MOS-CAP 133.

Figure 6:
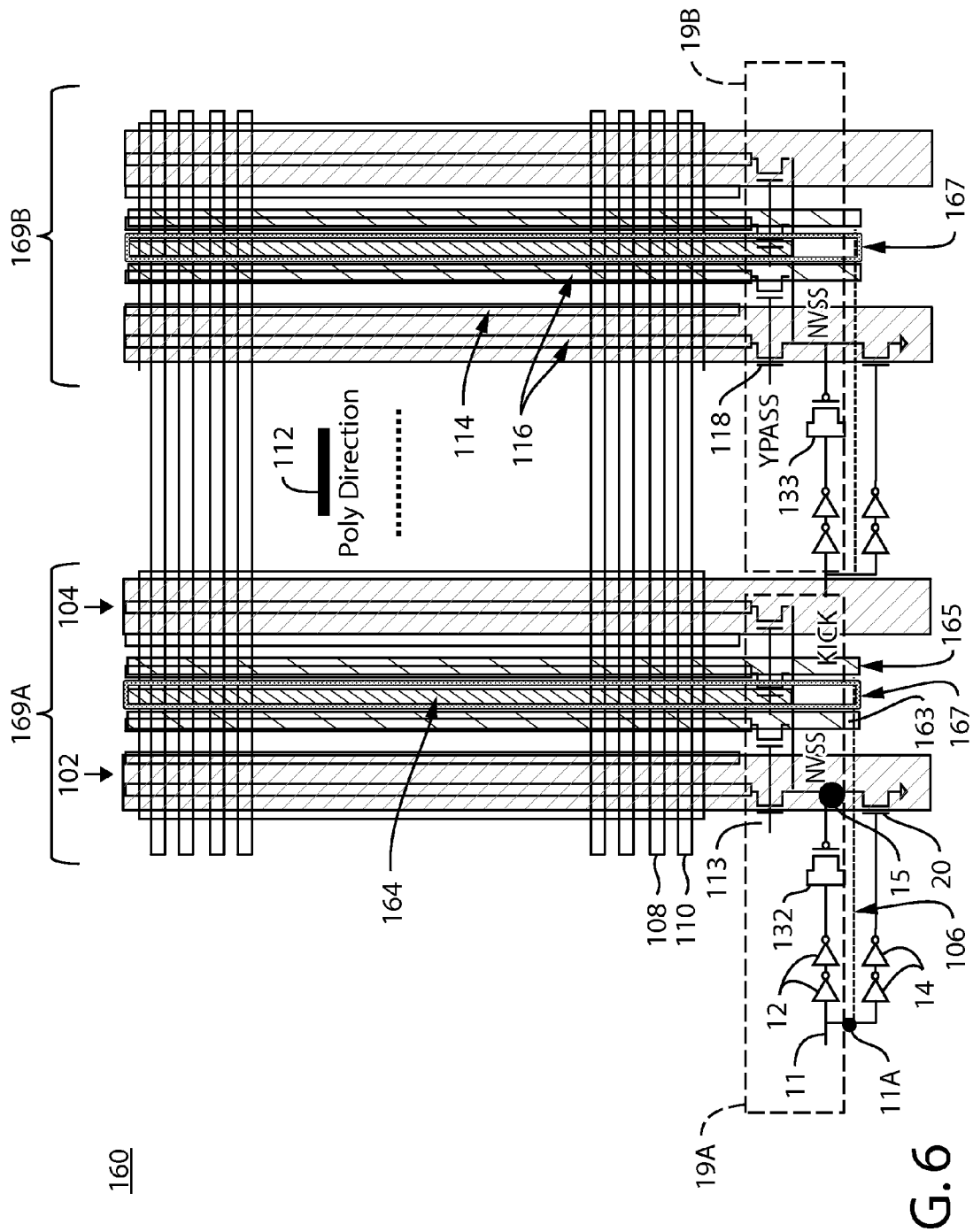
FIG. 6 is another schematic illustration of a memory cell array having a metal coupling capacitor and a MOS-CAP according to another embodiment of the present subject matter.

The memory cell 160 of FIG. 6 is similar to the memory cell 130 of FIG. 3 with the exception of further including a portion of the write-assist circuit in the form of a conductive trace 167 disposed in a fourth metal layer (e.g., M4, M5). In some embodiments, the conductive trace 167 is substantially in parallel with the at least two conductive traces 164 and 163 or 165 that are formed in a third metal layer (e.g., M3, M4).

Figure 6A:
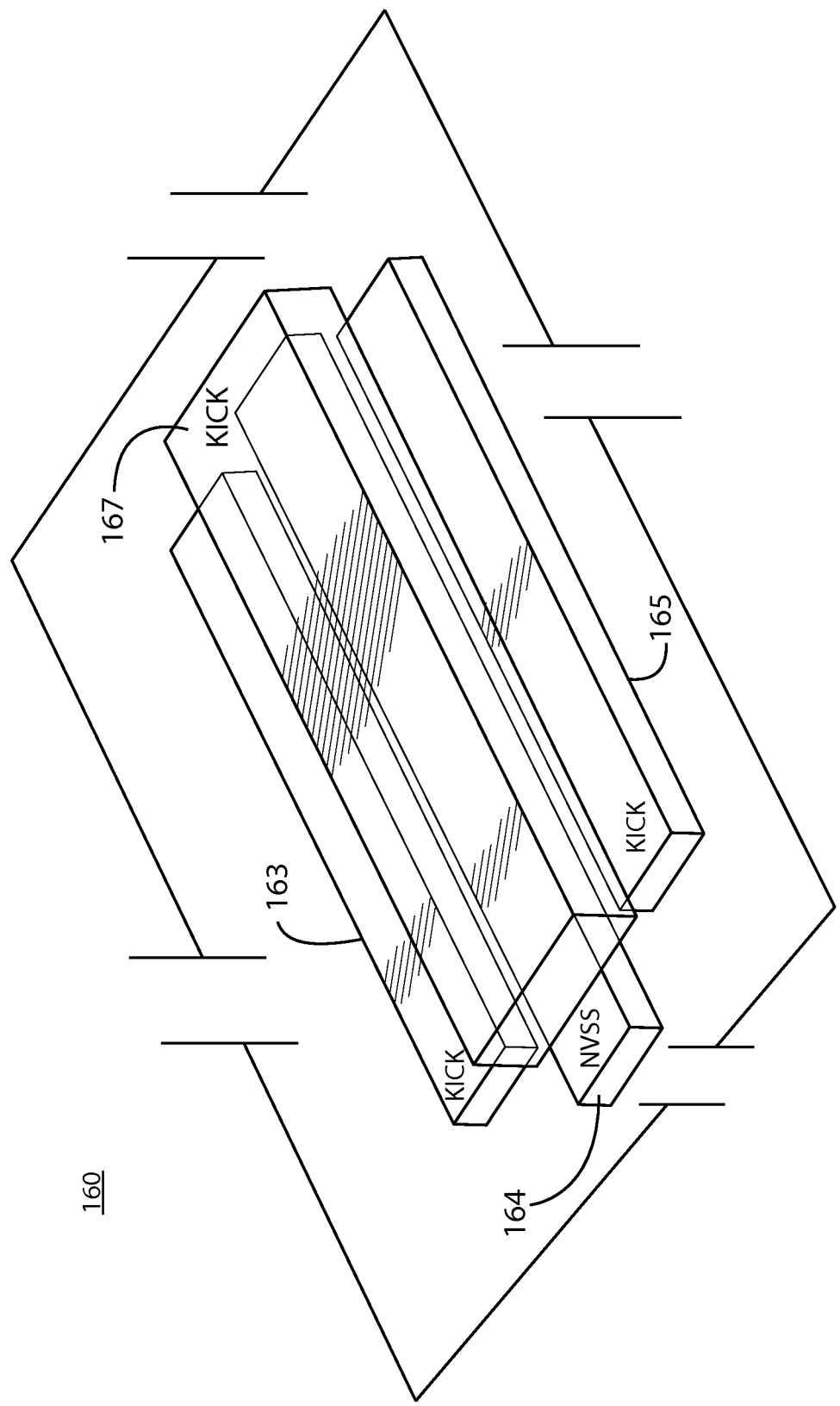
FIG. 6A is a cross sectional view of a portion of FIG. 6 according to an embodiment of the present subject matter.

FIG. 6A is a cross sectional view of a portion of the memory cell 160 illustrating the conductive traces 163, 164, 165, and 167. In this embodiment, with reference to FIGS. 6 and 6A, a second conductive trace 163 or 165 of the at least two conductive traces on the third metal layer and the conductive trace 167 on the fourth metal layer are shunted together and connected to the enable input or trigger signal 11 of the write-assist circuit 19A via line 106. A first conductive trace 164 of the at least two conductive traces connects to a driving source node 15 for driving bit line 116. In some embodiments, the second conductive traces 163 and 165 and the conductive trace 167 on the fourth metal layer 167 are shunt together and further connected to an enable input or trigger signal 11 of the write-assist circuit 19A. In the memory cell array 160, the power lines 102, 104 and the conductive traces 163, 164, 165 and the fourth metal layer 167 form the macro cell sub-block 169A driven by the write-assist having MOS-CAP 132. Another macro cell sub-block 169B is driven by the write-assist circuit having MOS-CAP 133.

Figure 7:
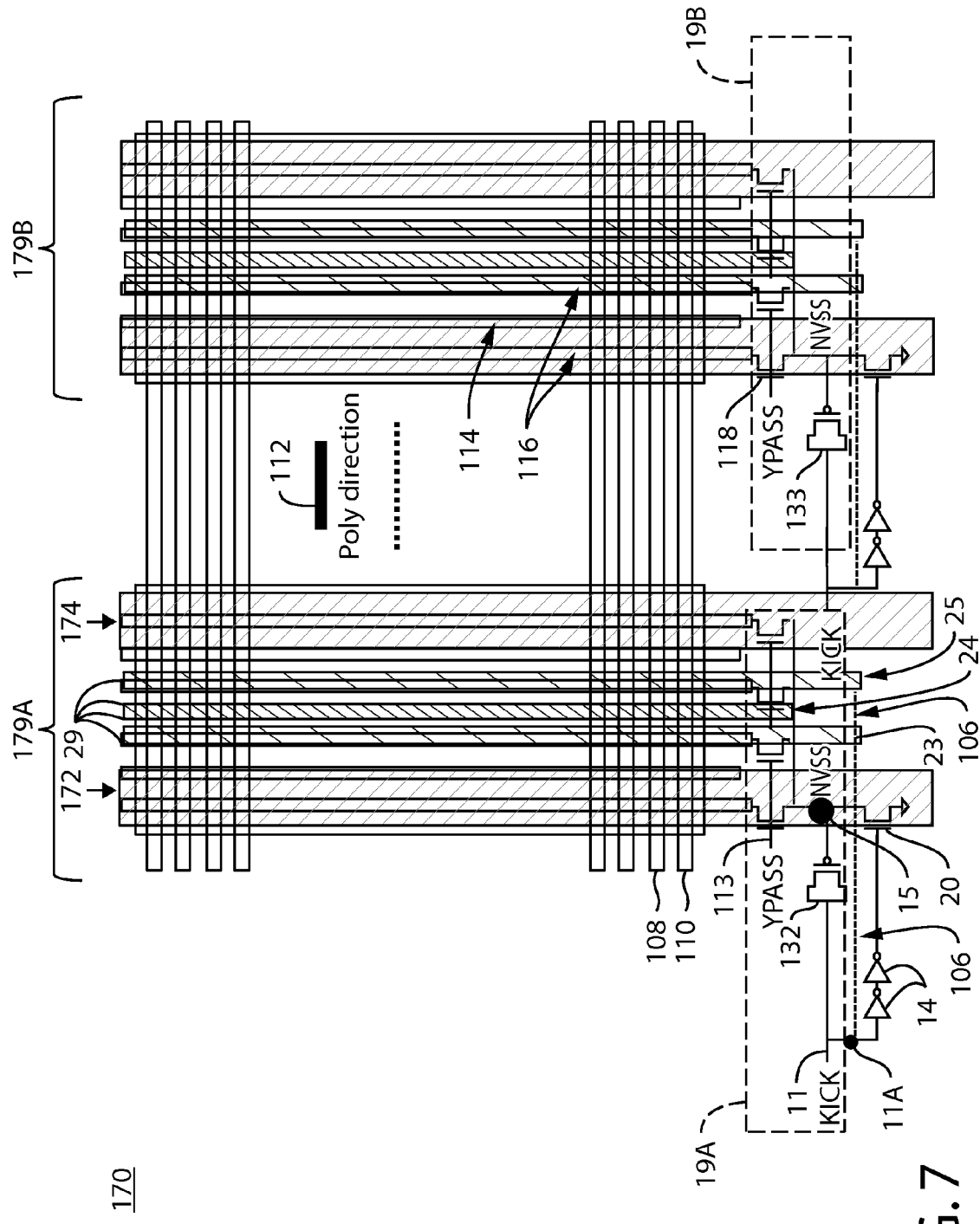
FIG. 7 is another schematic illustration of a memory cell array having a metal coupling capacitor and a MOS-CAP according to another embodiment of the present subject matter.

FIG. 7 illustrates a memory cell array 170 similar to memory cell 130 of FIG. 3, except some of the components are placed on different metal layers and the optional inverters (12) are removed. For example, in the memory cell array 170, the enable input or trigger signal 11 is coupled to a source and drain of a MOS-CAP 132 with the gate of MOS-CAP 132 being coupled to driving source node 15. As explained above, the MOS-CAP 132 can have a smaller physical size while still providing sufficient capacitance for the shortest bit line among the plurality of bit lines 116 in the memory array 130. By providing the embedded metal coupling capacitors 29 between conductive traces 24 and 23 or 25, a sufficient capacitance for the bit lines of varying length is provided without having to over-design the MOS-CAP 132 for the longer bit lines. In FIG. 7, the at least two conductive traces 24 and 23 or 25 are disposed substantially adjacent to each other and extend across the memory cell array in a parallel fashion. In the memory cell array 170, the power lines 172, 174 and the conductive traces 23, 24, and 25 of the macro cell sub-block 179A are driven by the write-assist circuit 19A having MOS-CAP 132. Another macro cell sub-block 179B is driven by the write-assist circuit 19B having MOS-CAP 133. In some embodiments as shown in FIG. 7, the memory array 130 includes at least three conductive traces (24, 23 and 25) formed in the third metal layer (e.g., M3) such that the conductive traces 24, 23, and 25 are disposed substantially adjacent to each other and extend at least partially across the memory cell array 170. A middle conductive trace 24 of the at least three conductive traces connects to a driving source node 15 for the bit lines 116, and the other two conductive traces 23, 25, which are disposed on opposite sides of the middle conductive trace 24, are shunted together and connected to an enable input or trigger signal 11 of the write-assist circuit 19A via line 106. In this embodiment, the optional inverters (see inverters 12 in FIG. 3) are excluded from the write-assist circuit 19A.

Figure 8:
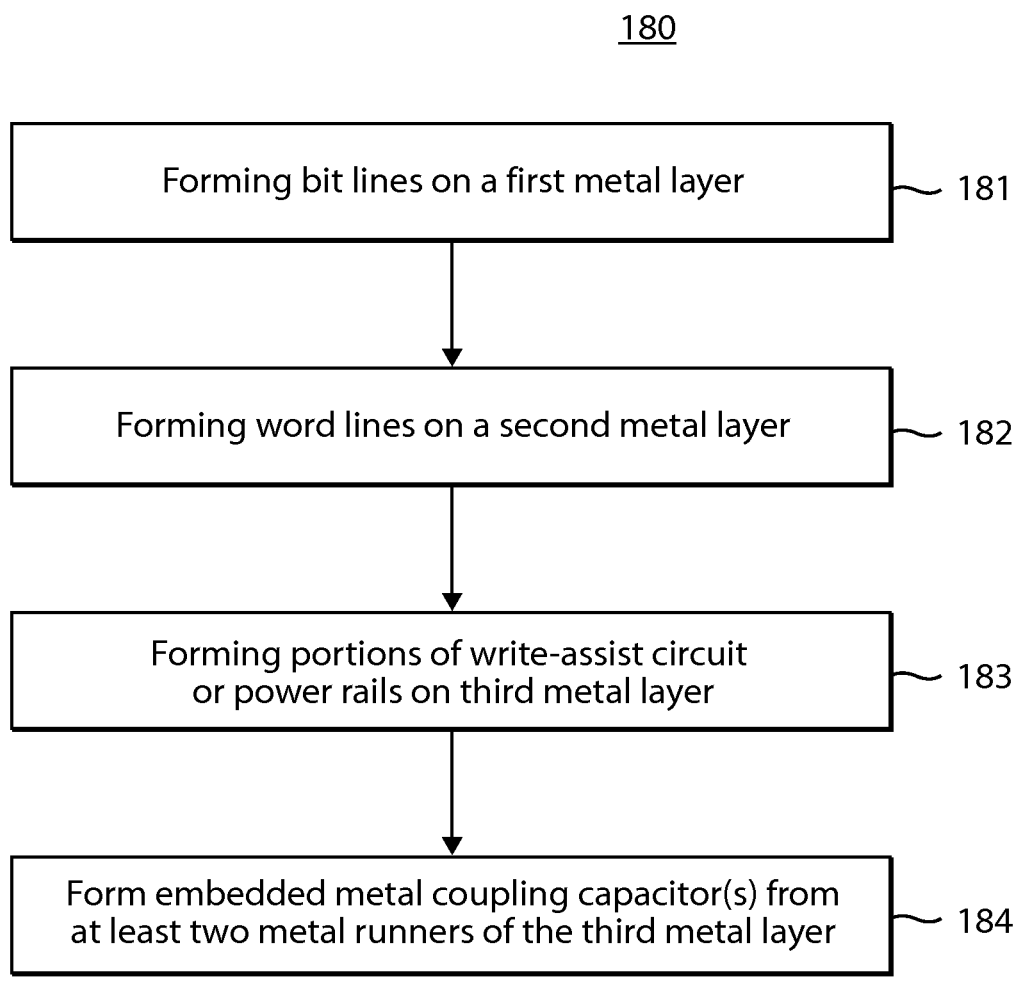
FIG. 8 is a flow diagram of a method forming a negative bit line voltage boost circuit according to several embodiments of the present subject matter.

FIG. 8 is a flow diagram of a method 180 forming a constant negative bit line voltage boost circuit. At step 181 bit lines are formed in a first metal layer. The first metal layer can be formed from copper or aluminum. or heavily doped poly silicon, for example.

At step 182, word lines of the memory cell array are formed in a second metal layer. The word lines are formed of the same materials as listed above as used on the bit lines.

At step 183, the method forms conductive traces that form portions of a write-assist circuit or portions of power rails for the memory cell array on a third metal layer. In some embodiments, the power rails extend substantially across the memory cell array. In some embodiments, the portion of the third metal layer forming the write assist circuit extends at least partially across the memory cell array. In some embodiments, the portion forming the write assist circuit extends substantially across or entirely across the memory cell array.

At step 184, at least two conductive traces are formed in the third metal layer and form embedded metal coupling capacitors. For example, the at least two conductive traces are formed such that they are disposed substantially adjacent and parallel to each other. The at least two conductive traces of the third metal layer extend at least partially across the memory cell array where a first conductive trace of the at least two conductive traces connects to a driving source node of a bit line and a second conductive trace of the at least two conductive traces connects to an enable input of the write-assist circuit. In some embodiments, the embedded metal coupling capacitors have a capacitance value proportional to a bit line length of each bit line of the memory cell array. In some embodiments, the embedded metal coupling capacitors enable a constant negative boost voltage across the bit line length of each bit line of the memory cell array.

In some embodiments, an integrated circuit includes a plurality of bit cells of a memory cell array disposed in a first metal layer and extending in a first direction, a plurality of word lines of the memory cell array disposed in a second metal layer and extending in a second direction that is different from the first direction, and at least two conductive traces disposed in a third metal layer substantially adjacent to each other and extending at least partially across the memory cell array, a first conductive trace of the at least two conductive traces coupled to a driving source node of a write assist circuit and a second conductive trace of the at least two conductive traces coupled to an enable input of the write-assist circuit. The at least two conductive traces form at least one embedded capacitor having a capacitive coupling to the bit line. In some embodiments, the at least two conductive traces of the third metal layer are substantially in parallel to each other. and extend across the memory cell array. In some embodiments, the integrated circuit further includes power rails formed on the third metal layer where the power rails extend across the memory cell array. In some embodiment, the at least two conductive traces of the third metal layer vary in at least one of length, width, spacing or shape to form a metal coupling capacitor in the memory cell array. In some embodiments, the at least two conductive traces of the third metal have a sawtooth formation.

In some embodiments, the integrated circuit includes a gate electrode layer of a poly silicon layer arranged substantially perpendicular to the at least two conductive traces of the third metal layer. In some embodiments, the integrated circuit includes a conductive trace of the write assist circuit formed in a fourth metal layer being parallel with the at least two conductive traces, wherein the second conductive trace of the at least two conductive traces and the conductive trace of the fourth metal layer are shunt together and connected to the enable input of the write-assist circuit.

In some embodiments, the at least two conductive traces are disposed substantially parallel to each other and extend across the memory cell array and where the first conductive trace of the at least two conductive traces is connected to a gate of the MOS-CAP of the write assist circuit of the memory cell array. In some embodiments, the MOS-CAP forms a portion of the write-assist circuit and a first conductive trace of the at least two conductive traces connects to a gate of the MOS-CAP. In some embodiments, the write assist circuit includes a MOS-CAP having a capacitance value based on a length of a shortest bit line and the at least one embedded capacitor has a capacitance based on a length of bit lines other than the shortest bit line. In some embodiments, the at least two conductive traces provide a constant negative bit line voltage for different bit line lengths. In some embodiments, the write-assist circuit is a negative write assist circuit. Note, the memory cell array can form a portion of a SRAM, single port SRAM (SPSRAM), dual port SRAM (DPSRAM), two-port register file (2pRF) or ultra-high density two-port register file (UHD2pRF) configurable array. In some embodiments, the memory cell array forms a portion of any type of SRAM.

In some embodiments, an integrated circuit includes a plurality of bit cells of a memory cell array disposed in a first metal layer, a plurality of word lines of the memory cell array disposed in a second metal layer and extending in a second direction that is different from the first direction, and at least two conductive traces forming at least a portion of the power rails for the memory cell array disposed on a third metal layer, the power rails extending substantially across the memory cell array. The integrated circuit further includes at least three conductive traces disposed on the third metal layer substantially adjacent to each other and extending at least partially across the memory cell array, a middle conductive trace of the at least three conductive traces couples to a driving source node of a write assist circuit and two outside conductive traces of the at least three conductive traces shunt together and couple to an enable input of the write-assist circuit. The integrated circuit further includes a metal oxide semiconductor capacitor (MOS-CAP) forming a portion of the write-assist circuit. In some embodiments, the at least three conductive traces form at least two metal coupling capacitors embedded in the memory cell array.

In some embodiments, a method of forming an integrated circuit includes the steps of forming bit lines of a memory cell array in a first metal layer, forming word lines of the memory cell array in a second metal layer, and forming at least one embedded coupling capacitor from at least two conductive traces disposed on a third metal layer where the at least two conductive traces are adjacent to each other and extend at least partially across the memory cell array. In some embodiments, a first conductive trace of the at least two conductive traces couples to a driving source node of a write assist circuit and a second conductive trace of the at least two conductive traces couples to an enable input of the write-assist circuit. In some embodiments, the at least one embedded coupling capacitor has a capacitance value proportional to a bit line length of each bit line of the memory cell array. In some embodiments, the at least one embedded coupling capacitor has a constant negative boost voltage across a bit line length of each bit line of the memory cell array. In some embodiments, coupling the first conductive trace of the at least two conductive traces to the driving source node includes connecting the first conductive trace to a gate of a metal oxide semiconductor capacitor of the write-assist circuit.

The preceding merely illustrates the principles of certain examples. It will thus be appreciated that those skilled in the art will be able to devise various arrangements which, although not explicitly described or shown herein, embody the principles and are included within their spirit and scope. Furthermore, all examples and conditional language recited herein are principally intended expressly to be only for pedagogical purposes and to aid the reader in understanding the principles and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the subject matter has been described in terms of exemplary embodiments, it is not limited thereto. Rather, the appended claims should be construed broadly, to include other variants and embodiments, which may be made by those skilled in the art without departing from the scope and range of equivalents of the disclosure.

What is claimed is:

1. An integrated circuit, comprising:
    a plurality of bit lines of a memory cell array disposed in a first metal layer and extending in a first direction;
    a plurality of word lines of the memory cell array disposed in a second metal layer and extending in a second direction that is different from the first direction; and
    at least two conductive traces disposed in a third metal layer substantially adjacent to each other and extending at least partially across the memory cell array, a first one of the at least two conductive traces coupled to a driving source node of a write assist circuit, and a second conductive trace of the at least two conductive traces coupled to an enable input of the write-assist circuit, wherein the write-assist circuit comprises at least two serially coupled inverters, a capacitor having a first node coupled to an output of the at least two serially coupled inverters and a second node coupled to the driving source node, and a metal oxide semiconductor transistor having a source coupled to the driving source node and a drain coupled to at least one of the plurality of bit lines, wherein the at least two conductive traces form at least one embedded capacitor having a capacitive coupling to the at least one of the plurality of bit lines.

2. The integrated circuit of claim 1, wherein the at least two conductive traces are disposed substantially parallel to each other and extend across the memory cell array.

3. The integrated circuit of claim 1, further comprising power rails for the memory cell formed on the third metal layer, the power rails extending across the memory cell array.

4. The integrated circuit of claim 1, wherein the at least two conductive traces have a saw-tooth formation.

5. The integrated circuit of claim 1, further comprising a gate electrode layer of a poly silicon layer arranged substantially perpendicular to the at least two conductive traces of the third metal layer.

6. The integrated circuit of claim 1, further comprising a conductive trace of the write assist circuit formed in a fourth metal layer being parallel with the at least two conductive traces, wherein the second conductive trace of the at least two conductive traces and the conductive trace of the fourth metal layer are shunt together and connected to the enable input of the write-assist circuit.

7. The integrated circuit of claim 1, wherein the at least two conductive traces are disposed substantially parallel to each other and extend across the memory cell array, and wherein the first conductive trace of the at least two conductive traces is connected to a gate of a metal oxide semiconductor capacitor (MOS-CAP) of the write assist circuit of the memory cell array.

8. The integrated circuit of claim 1, wherein the at least two conductive traces vary in at least one of length, width, or spacing.

9. The integrated circuit of claim 1, wherein the at least two conductive traces vary in at least one of length, width, spacing or shape array.

10. The integrated circuit of claim 1, wherein the write assist circuit includes a metal oxide semiconductor capacitor (MOS-CAP) having a capacitance value based on a length of a shortest bit line, and the at least one embedded capacitor has a capacitance based on a length of bit lines other than the shortest bit line.

11. The integrated circuit of claim 1, wherein the write-assist circuit is a negative bit-line write-assist circuit.

12. The integrated circuit of claim 1, wherein the second metal layer is formed above the first metal layer and the third metal layer is formed above the second metal layer.

13. The integrated circuit of claim 1, wherein the at least two conductive traces provide a constant negative bit line voltage for different bit line lengths.

14. The integrated circuit of claim 1, wherein the memory cell array forms a portion of a SRAM, a single port SRAM (SPSRAM), a dual port SRAM (DPSRAM), a two-port register file (2pRF) or an ultra-high density two-port register file (UHD2pRF) configurable array.

15. An integrated circuit, comprising:
a plurality of bit lines of a memory cell array disposed in a first metal layer and extending in a first direction;
a plurality of word lines of the memory cell array disposed in a second metal layer and extending in a second direction that is different from the first direction;
at least two conductive traces disposed in a third metal layer and forming at least a portion of power rails for the memory cell array, the power rails extending substantially across the memory cell array; and
at least three conductive traces disposed on the third metal layer substantially adjacent to each other and extending at least partially across the memory cell array, a middle conductive trace of the at least three conductive traces couples to a driving source node of a write assist circuit and two outside conductive traces of the at least three conductive traces shunt together and couple to an enable input of the write-assist circuit, wherein the write-assist circuit comprises at least two serially coupled inverters, a capacitor having a first node coupled to an output of the at least two serially coupled inverters and a second node coupled to the driving source node, and a metal oxide semiconductor transistor having a source coupled to the driving source node and a drain coupled to at least one of the plurality of bit lines.

16. The integrated circuit of claim 15, wherein the at least three conductive traces form at least two metal coupling capacitors embedded in the memory cell array.

17. A method of forming a memory cell array, the method comprising:
forming a plurality of bit lines of the memory cell array in a first metal layer;
forming a plurality of word lines of the memory cell array in a second metal layer; and
forming the at least one embedded coupling capacitor from at least two conductive traces disposed in a third metal layer, wherein forming the at least one embedded coupling capacitor includes:
coupling a first conductive trace of the at least two conductive traces to a driving source node of a write-assist circuit and
coupling a second conductive trace of the at least two conductive traces to an enable input of the write-assist circuit, wherein the write-assist circuit comprises at least two serially coupled inverters, a capacitor having a first node coupled to an output of the at least two serially coupled inverters and a second node coupled to the driving source node, and a metal oxide semiconductor transistor having a source coupled to the driving source node and a drain coupled to at least one of the plurality of bit lines.

18. The method of claim 17, wherein the at least one embedded coupling capacitor has a capacitance value proportional to a bit line length of each bit line of the memory cell array.

19. The method of claim 17, wherein the at least one embedded coupling capacitor provides a constant negative boost voltage across a bit line length of each bit line of the memory cell array.

20. The method of claim 17, wherein coupling the first conductive trace of the at least two conductive traces to the driving source node comprises connecting the first conductive trace to a gate of a metal oxide semiconductor capacitor of the write-assist circuit.

\* \* \* \* \*